(12) United States Patent
Lin et al.

(10) Patent No.: US 12,721,059 B2
(45) Date of Patent: Aug. 25, 2026

(54) TITANIUM NITRIDE GAPFILL PROCESSES FOR SEMICONDUCTOR STRUCTURES

(71) Applicant: Applied Materials, Inc., Santa Clara, CA (US)

(72) Inventors: Yongjing Lin, San Jose, CA (US); Zhihui Liu, Sunnyvale, CA (US); Shih Chung Chen, Cupertino, CA (US); Haoyan Sha, San Jose, CA (US); Alexander Jansen, Danville, CA (US); Zhebo Chen, Santa Clara, CA (US); Janardhan Devrajan, Santa Clara, CA (US); Tza-Jing Gung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 389 days.

(21) Appl. No.: 18/377,619

(22) Filed: Oct. 6, 2023

(65) Prior Publication Data

US 2025/0118563 A1 Apr. 10, 2025

(51) Int. Cl.
*H10P 14/40* (2026.01)
*H10D 30/01* (2025.01)
(Continued)

(52) U.S. Cl.
CPC ......... *H10P 14/418* (2026.01); *H10D 30/014* (2025.01); *H10D 30/6735* (2025.01);
(Continued)

(58) Field of Classification Search
CPC .......................... H10P 14/418; H10D 30/014; H10D 30/6735; H10D 30/6757; H10D 62/121;
(Continued)

(56) References Cited

U.S. PATENT DOCUMENTS 8,030,202 B1 * 10/2011 Horak ................ H10W 20/072 438/619
2012/0052681 A1 3/2012 Marsh
(Continued)

FOREIGN PATENT DOCUMENTS

WO 2019040046 A1 2/2019

OTHER PUBLICATIONS

U.S. Appl. No. 18/203,417, filed May 30, 2023, 33 pages.
(Continued)

*Primary Examiner* — Wasiul Haider
(74) *Attorney, Agent, or Firm* — SERVILLA WHITNEY LLC

(57) ABSTRACT

One or more embodiments of the disclosure are directed to methods of forming structures that are useful for FEOL and BEOL processes. Embodiments of the present disclosure advantageously provide methods of depositing a gapfill material, such as titanium nitride (TiN), in high aspect ratio (AR) structures with small dimensions. Some embodiments advantageously provide seam-free high-quality TiN films to fill high AR trenches with small dimensions. Embodiments of the present disclosure advantageously provide methods of filling 3D structures, such as FinFETs, GAAs, and the like, with a gapfill material without creating a seam. One or more embodiments include selective deposition processes using a carbon (C) layer in order to provide seam-free TiN gapfill in 3D structures, such as GAA devices.

20 Claims, 7 Drawing Sheets

(51) Int. Cl.
*H10D 30/67* (2025.01)
*H10D 62/10* (2025.01)
*H10D 64/01* (2025.01)

(52) U.S. Cl.
CPC ....... *H10D 30/6757* (2025.01); *H10D 62/121* (2025.01); *H10D 64/01* (2025.01)

(58) Field of Classification Search
CPC .... H10D 64/01; H10D 30/019; H10D 30/501; H10W 20/0765; H10W 20/057
See application file for complete search history.

(56) References Cited

U.S. PATENT DOCUMENTS

| | | | | |
|---|---|---|---|---|
| 2018/0033689 | A1* | 2/2018 | Anthis ................ | H10W 20/056 |
| 2018/0061628 | A1 | 3/2018 | Ou | |

OTHER PUBLICATIONS

U.S. Appl. No. 18/228,301, filed Jul. 31, 2023, 54 pages.
U.S. Appl. No. 63/482,295, filed Jan. 30, 2023, 36 pages.
Choi, Yoenju , et al., "Bottom-up plasma-enhanced atomic layer deposition of SiO2 by utilizing growth inhibition using NH3 plasma pre-treatment for seamless gap-fill process", Scientific Reports 12, Article No. 15756 (2022).

* cited by examiner

TITANIUM NITRIDE GAPFILL PROCESSES FOR SEMICONDUCTOR STRUCTURES

TECHNICAL FIELD

Embodiments of the present disclosure pertain to the field of semiconductor devices and semiconductor device manufacturing. More particularly, embodiments of the disclosure relate to gapfill processes, such as titanium nitride (TiN) gapfill processes, for semiconductor devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (FinFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, FinFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, FinFETs, and gate-all-around (GAA) structures. The GAA device structure includes several lattice matched channels suspended in a stacked configuration and connected by source/drain regions. The GAA structure provides good electrostatic control and can find broad adoption in semiconductor manufacturing processes.

In manufacturing, three-dimensional (3D) structures, such as FinFETs, GAAs, and the like, are made by atomic layer deposition of titanium nitride (TiN) and tungsten (W) stacks. A seam is often observed from an ALD or CVD deposited TiN film. This seam creates issues during downstream processes.

Accordingly, there is an ongoing need in the art for methods to fill structures, such as FinFETs, GAAs, and the like, with a gapfill material without creating a seam.

SUMMARY

One or more embodiments of this disclosure are directed to a method of filling a trench in a semiconductor substrate. The method comprises: depositing a carbon (C) layer on the trench, the trench including a top surface, a bottom surface, and two opposed sidewalls. The carbon (C) layer forms on the top surface and on a portion of the two opposed sidewalls. The method further comprises conformally depositing a first titanium nitride (TiN) layer on the bottom surface of the trench; removing the carbon (C) layer; and depositing a second titanium nitride (TiN) layer on the first TiN layer. The first TiN layer and the second TiN layer combine to fill the trench with a titanium nitride (TiN) gapfill material that is substantially free of seams and/or voids.

Additional embodiments of this disclosure are directed to a method of forming a semiconductor device. The method comprises: optionally, conformally depositing a first titanium nitride (TiN) layer having a thickness in a range of from 10 Å to 15 Å directly on a semiconductor structure formed on a top surface of a semiconductor substrate. The semiconductor structure comprises a plurality of nanosheets. Each of the plurality of nanosheets are separated by a trench. The method further comprises depositing a carbon (C) layer on the semiconductor structure; forming a second titanium nitride (TiN) layer to fill a portion of the trench. The second TiN layer grows from within the trench. The method further comprises removing the carbon (C) layer; and depositing a third titanium nitride (TiN) layer on the second TiN layer to fill the trench with a titanium nitride (TiN) gapfill material that is substantially free of seams and/or voids.

Further embodiments of this disclosure are directed to a method of forming a gate-all-around (GAA) transistor. The method comprises: forming a superlattice structure on a top surface of a substrate. The superlattice structure comprises a plurality of nanosheet channel layers and a corresponding plurality of nanosheet release layers alternatingly arranged in a plurality of stacked pairs. In some embodiments, the plurality of nanosheet channel layers comprises silicon (Si) and the plurality of nanosheet release layers comprises silicon germanium (SiGe). The method further comprises patterning the superlattice structure to remove the plurality of nanosheet release layers and form a semiconductor structure comprising a plurality of nanosheets (e.g., the plurality of nanosheet channel layers), each of the plurality of nanosheets separated by a trench. The method further comprises conformally depositing a first titanium nitride (TiN) layer on the plurality of nanosheets; depositing a carbon (C) layer on a portion of the first TiN layer; forming a second titanium nitride (TiN) layer to fill a portion of the trench, the second TiN layer growing from within the trench; removing the carbon (C) layer; and forming a third titanium nitride (TiN) layer. The first TiN layer, the second TiN layer, and the third TiN layer combine to fill the trench with a titanium nitride (TiN) gapfill material that is substantially free of seams and/or voids.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

It is to be noted, however, that the appended drawings illustrate only some embodiments of this disclosure and are therefore not to be considered limiting of its scope, for the disclosure may admit to other equally effective embodiments.

DETAILED DESCRIPTION

Figure 1:
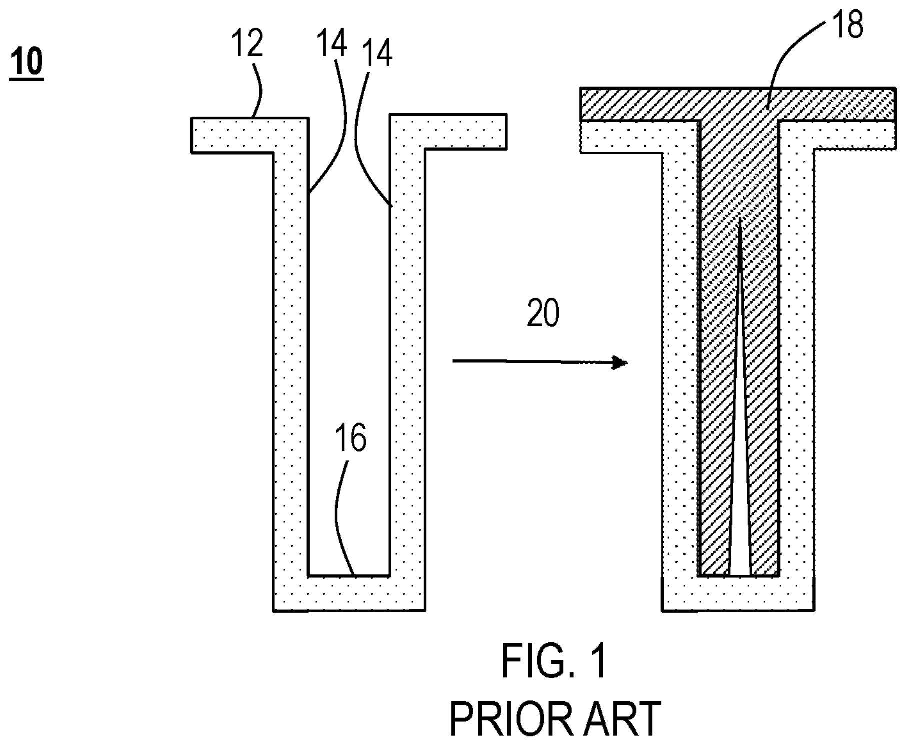
FIG. 1 illustrates a cross-sectional schematic view of a trench according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

Spatially relative terms, such as "beneath," "below," "lower," "above," "upper" and the like, may be used herein for ease of description to describe one element's relationship to another element(s) or feature(s) as illustrated in the Figures. It will be understood that the spatially relative terms are intended to encompass different orientations of the structure, e.g., the semiconductor device, in use or operation in addition to the orientation depicted in the figures. For example, if the semiconductor device in the Figures is turned over, elements described as "below" or "beneath" other elements would then be oriented "above" the other elements. Thus, the exemplary term "below" may encompass both an orientation of above and below. The semiconductor device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments," "some embodiments," or "an embodiment" means that a particular feature, structure, material, or characteristic described in connection with the embodiment is included in at least one embodiment of the disclosure. Thus, the appearances of the phrases such as "in one or more embodiments," "in certain embodiments," "in some embodiments," "in one embodiment," or "in an embodiment" in various places throughout this specification are not necessarily referring to the same embodiment of the disclosure. In one or more embodiments, the particular features, structures, materials, or characteristics are combined in any suitable manner.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pre-treatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as rectangular or square panes. In some embodiments, the substrate comprises a rigid discrete material. What a given substrate surface comprises will depend on what films are to be deposited, as well as the particular chemistry used.

Sputtering is a physical vapor deposition (PVD) process in which high-energy ions impact and erode a solid target and deposit the target material on the surface of a substrate, such as a semiconductor substrate. In semiconductor fabrication, the sputtering process is usually accomplished within a semiconductor fabrication chamber also known as a PVD processing chamber or a sputtering chamber. Sputtering has long been used for the deposition of metals and related materials in the fabrication of semiconductor integrated circuits.

Typically, the sputtering chamber comprises an enclosure wall that encloses a process zone into which a process gas is introduced, a gas energizer to energize the process gas, and an exhaust port to exhaust and control the pressure of the process gas in the chamber. The chamber is used to sputter deposit a material from a sputtering target onto the semiconductor substrate. In the sputtering processes, the sputtering target is bombarded by energetic ions, such as a plasma, causing material to be knocked off the target and deposited as a film on the semiconductor substrate.

A typical semiconductor fabrication chamber has a target assembly including disc-shaped target of solid metal or other material supported by a backing plate that holds the target. To promote uniform deposition, the PVD chamber may have an annular concentric metallic ring, which is often called a shield, circumferentially surrounding the disc-shaped target.

Plasma sputtering may be accomplished using either DC sputtering or RF sputtering. Plasma sputtering typically includes a magnetron positioned at the back of a sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., manganese precursor, ruthenium precursor, or a manganese-ruthenium precursor) is pulsed into the reaction zone followed by a first time delay. Next, a second precursor or compound B (e.g., reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate. In one or ore more embodiments, the gate surrounds all of the nanosheets between the bottom substrate and above channels.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel;

and gate (G), the terminal that modulates the channel conductivity. Conventionally, current entering the channel at the source(S) is designated Is and current entering the channel at the drain (D) is designated ID. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or NMOS FET, then the source and drain are n+ regions and the body is a p region. If the MOSFET is a p-channel or PMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double-or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nanoslabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., dynamic random access memory (DRAM)) and non-volatile (e.g., NAND) devices. As used herein, the term "nanosheet" refers to a two-dimensional nanostructure with a thickness in a scale ranging from about 0.1 nm to about 1000 nm. As used herein, the term "dynamic random access memory" or "DRAM" refers to a memory cell that stores a datum bit by storing a packet of charge (i.e., a binary one), or no charge (i.e., a binary zero) on a capacitor.

Without intending to be bound by theory, it is thought that relaxation in a vertically stacked superlattice structure comprising one or more hGAAs causes defects in nanosheet channel layers within the structure. Embodiments of the present disclosure advantageously provide transistors which comprise a fully strained vertically stacked superlattice structure having nanosheet channel layers that are free or substantially free of defects. In some embodiments, the presence of defects in the nanosheet channel layers are determined by a reciprocal space mapping (RSM) method. Generally, an RSM method is an x-ray diffraction method of collecting diffraction data of the vertically stacked superlattice structure in which the presence of defects may be observed. As used herein, the term "substantially free" means that the nanosheet channel layers are substantially free of defects as determined by an RSM method.

Generally, front-end of line (FEOL) refers to the first portion of integrated circuit fabrication, including transistor fabrication, middle of line (MOL) connects the transistor and interconnect parts of a chip using a series of contact structures, and back-end of line (BEOL) refers to a series of process steps after transistor fabrication through completion of a wafer. One or more embodiments of the disclosure are directed to methods of forming structures that are useful for FEOL and BEOL processes.

Embodiments of the present disclosure advantageously provide methods of depositing a gapfill material, such as titanium nitride (TiN), in high aspect ratio (AR) structures with small dimensions. Some embodiments advantageously provide seam-free high-quality films, such as TiN films, to fill high AR trenches with small dimensions.

Embodiments of the present disclosure advantageously provide methods of filling 3D structures, such as FinFETs, GAAs, DRAM word lines, and the like, with a gapfill material without creating a seam. One or more embodiments of the disclosure are directed to methods of seam-free titanium nitride (TiN) gapfill in GAA devices.

In one or more embodiments, transistors, such as the starting structure of a GAA transistor shown in the accompanying drawings, are fabricated using a standard process flow known to the skilled artisan.

It has advantageously been found that selective deposition processes can be used to provide seam-free gapfill, such as titanium nitride (TiN) gapfill, in 3D structures (e.g., GAA devices). Selective deposition has shown promise in device miniaturization as it has the potential to remove costly lithographic steps by simplifying integration schemes. Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be tuned to modulate the chemical kinetics of a particular surface reaction. Another possible scheme involves surface pretreatments that can be used to activate or deactivate a surface of interest to an incoming film deposition precursor. For example, a carbon (C) layer can be formed on a surface to prevent subsequent deposition on that surface. Advantageously, a carbon (C) layer can be used to inhibit or prevent subsequent deposition within a trench, such as a trench in a GAA device to enable seam-free gapfill, e.g., titanium nitride (TiN) gapfill.

The embodiments of the disclosure are described by way of the Figures, which illustrate semiconductor structures (e.g., trenches) and semiconductor devices (e.g., transistors) and processes for filling the semiconductor structures and forming the semiconductor devices in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a cross-sectional view of a feature, e.g., a trench 10 according to the prior art. In FIG. 1, the trench has a top surface 12, a bottom surface 16, and two opposed sidewalls 14. A titanium nitride (TiN) film 18 is deposited in the trench 10 according to operation 20. Operation 20 includes the deposition of the titanium nitride (TiN) film 18 by deposition techniques, including, but not limited to physical vapor deposition (PVD), chemical vapor deposition (CVD), or atomic layer deposition (ALD). In FIG. 1, the titanium nitride (TiN) film 18 includes a center seam as a result of any of PVD, CVD, or ALD. The center seam in the titanium nitride (TiN) film 18 may lead to a higher line resistance and/or an open circuit, i.e., device failure or defects. According to the prior art, it is thought that deposition of the titanium nitride (TiN) film 18 by PVD, CVD, or ALD will result in the titanium nitride (TiN) film 18 having a seam, such as a center seam, or voids in the film.

Figure 2A:
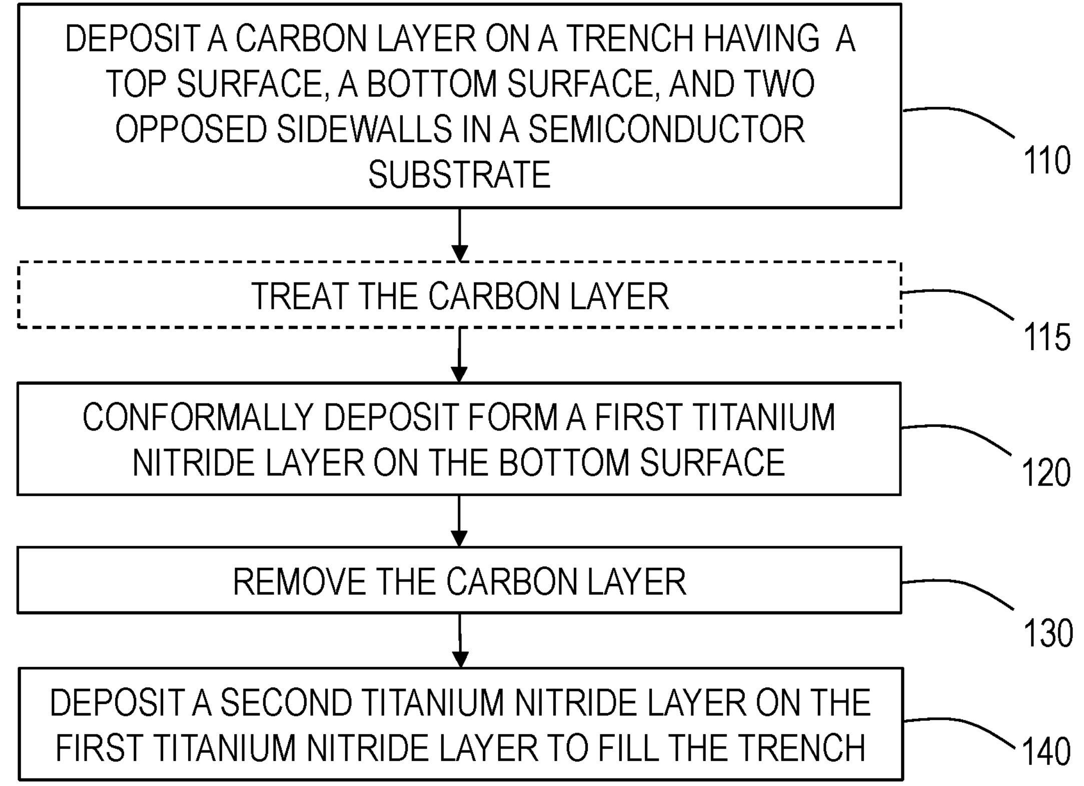
FIG. 2A illustrates a process flow diagram of a method of filling a trench in accordance with one or more embodiments of the disclosure.

Embodiments of the present disclosure advantageously provide seam-free gapfill, e.g., titanium nitride (TiN) gapfill processes. FIG. 2A illustrates a process flow diagram of a method 100 of filling a trench 200. FIGS. 2B-2F illustrate the operations in process flow of the method 100.

The trench 200 may be formed in any substrate surface, such as a semiconductor substrate. The trench 200 is shown including a top surface 212, a bottom surface 216, and two opposed sidewalls 214 for simplicity. While the disclosure is described with reference to the trench 200, it will be appreciated that the processes described herein can be implemented on any substrate surface having one or more features formed therein, one or more layers formed thereon, and combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom, and slot vias. The features described herein can have any suitable aspect ratio (ratio of the depth of the feature to the width of the feature). In one or more embodiments, the aspect ratio of the features described herein is greater than or equal to about 1:1, 2:1, 5:1, 10:1, 15:1, 20:1, 25:1, 30:1, 35:1, or 40:1. In one or more embodiments, the aspect ratio of the trench 200 is greater than or equal to about 1:1, 2:1, 5:1, 10:1, 15:1, 20:1, 25:1, 30:1, 35:1, or 40:1.

The method 100 comprises: depositing a carbon (C) layer 218 on the trench 200 (operation 110). The carbon (C) layer 218 forms on the top surface 212 and on a portion of the two opposed sidewalls 214. The method 100 optionally includes treating the carbon (C) layer 218 (operation 115). The method 100 includes conformally depositing a first titanium nitride (TiN) layer 220 on the bottom surface 216 of the trench 200 (operation 120); removing the carbon (C) layer 218 (operation 130); and depositing a second titanium nitride (TiN) layer 230 on the first TiN layer 220 (operation 140). The first TiN layer 220 and the second TiN layer 230 combining to fill the trench with a titanium nitride (TiN) gapfill material 250 that is substantially free of seams and/or voids, or free of seams and/or voids. In some embodiments, the method 100 consists essentially of operation 110, operation 115, operation 120, operation 130, and operation 140. In some embodiments, the method 100 consists of operation 110, operation 115, operation 120, operation 130, and operation 140.

In some embodiments, the method 100 comprising operation 110, optionally operation 115, operation 120, operation 130, and operation 140 defines a process cycle. The process cycle may be repeated any suitable number of times in order to form a gapfill material having a predetermined thickness. The process cycle may be repeated any suitable number of times depending on the processing conditions. In some embodiments, the process cycle comprising, consisting essentially of, or consisting of operation 110, operation 115, operation 120, operation 130, and operation 140 is repeated at least once.

The semiconductor substrate in which the trench 200 is formed can be any suitable substrate material. In one or more embodiments, the semiconductor substrate comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate comprises one or more of silicon (Si), germanium (Ge), gallium (Ga), arsenic (As), indium (In), phosphorus (P), or selenium (Se). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

Figures 2B, 2C, 2D, 2E, 2F:
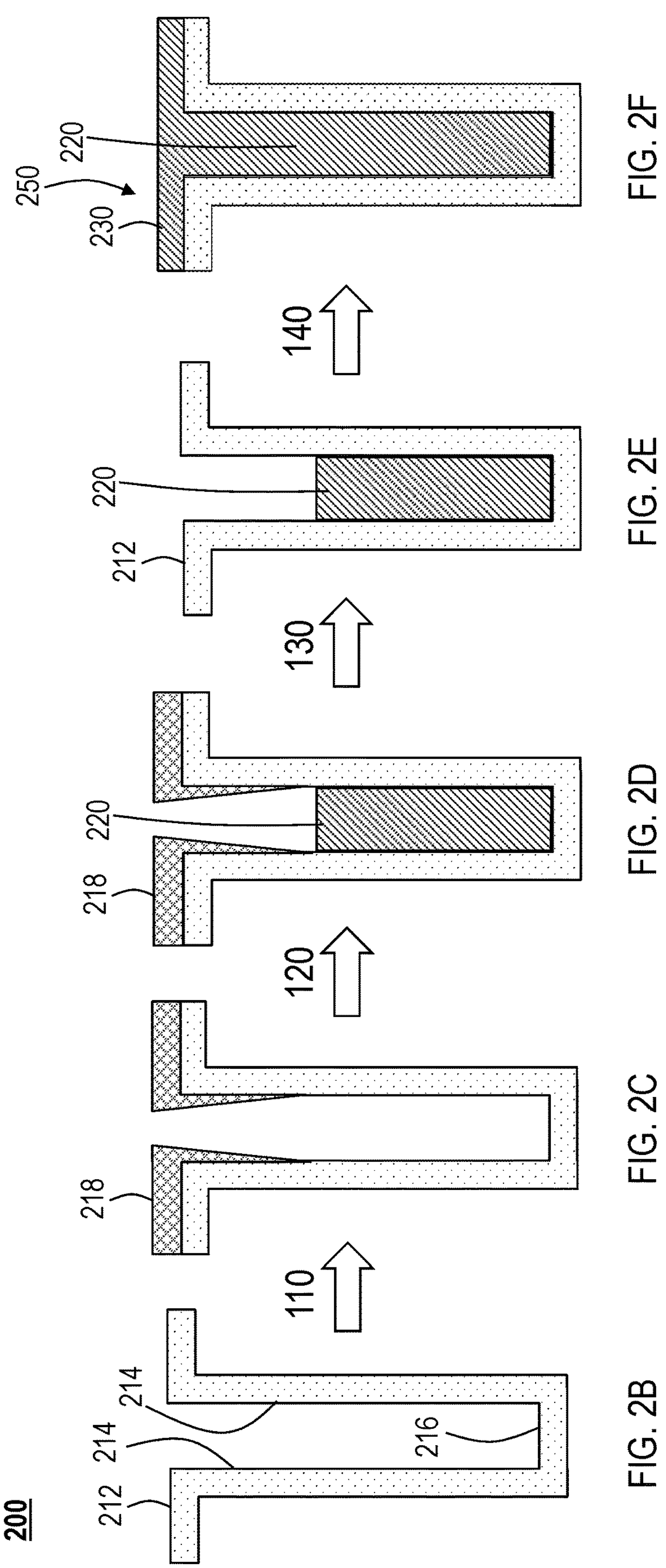
FIG. 2B illustrates a cross-sectional schematic view of a trench in accordance with one or more embodiments of the disclosure.
FIG. 2C illustrates deposition of a carbon (C) layer on the trench of FIG. 2B.
FIG. 2D illustrates deposition of a first titanium nitride (TiN) layer in the trench of FIG. 2C.
FIG. 2E illustrates removal of the carbon (C) layer from the trench of FIG. 2D.
FIG. 2F illustrates deposition of a second titanium nitride (TiN) layer on the first titanium nitride (TiN) layer to fill the trench of FIG. 2E.

Referring to FIGS. 2A and 2C, at operation 110, the carbon (C) layer 218 is deposited using a deposition technique, such as, but not limited to, ALD, CVD, PVD, MBE, MOCVD, spin-on, or other insulating layer deposition techniques known to the skilled artisan. In one or more embodiments, the carbon (C) layer 218 is deposited using PVD or CVD. In one or more embodiments, the carbon (C) layer 218 is deposited using PVD.

The carbon (C) layer 218 has a top surface thickness and a sidewall thickness. In one or more embodiments, the thickness (the top surface thickness and the sidewall thickness) of the carbon (C) layer 218 varies and depends on the dimensions of the trench 200. In one or more embodiments, such as when the carbon (C) layer 218 is deposited by PVD the top surface thickness is greater than the sidewall thickness.

In one or more embodiments, the top surface thickness is in a range of from 5 Å to 50 Å. In one or more embodiments, the sidewall thickness is in a range of from 5 Å to 40 Å. In one or more embodiments, the sidewall thickness varies within the range of from 5 Å to 40 Å depending on the particular process conditions.

In one or more embodiments, the sidewall thickness is a gradient thickness that decreases from a top portion of the sidewall (the portion closer to the top surface 212) towards the bottom surface 216. In one or more embodiments, the sidewall thickness is a gradient thickness that is in the range of from 5 Å to 40 Å.

In one or more embodiments, the method 100 includes treating the carbon (C) layer 218 with a plasma (operation 115). In some embodiments, the carbon (C) layer 218 deposited by PVD is treated with the plasma at operation 115. In some embodiments, the carbon (C) layer 218 deposited by CVD is treated with the plasma at operation 115. The carbon (C) layer 218 may be treated with the plasma (operation 115) in any suitable processing chamber that has plasma capability, including but not limited to, PVD chambers and CVD chambers.

The plasma can include any suitable composition. The plasma may be generated by any suitable plasma source known to the skilled artisan. In one or more embodiments, the plasma used to treat the carbon (C) layer 218 at operation 115 comprises hydrogen ($H_2$) or a mixture of nitrogen ($N_2$) and hydrogen ($H_2$). The plasma comprising the mixture of nitrogen ($N_2$) and hydrogen ($H_2$) may include any suitable ratio of nitrogen ($N_2$) and hydrogen ($H_2$) in the mixture. In one or more embodiments, treating the carbon (C) layer 218 at operation 115 includes a low temperature, low power process. In one or more embodiments, the carbon (C) layer 218 is treated at a temperature less than or equal to 350° C., less than or equal to 300° C., less than or equal to 250° C., less than or equal to 200° C., less than or equal to 150° C., less than or equal to 100° C., less than or equal to 50° C., or less than or equal to room temperature. In one or more embodiments, the carbon (C) layer 218 is treated at a power of less than or equal to 100 watts, less than or equal to 50 watts, less than or equal to 25 watts, or less than or equal to 10 watts. In one or more embodiments, the carbon (C) layer 218 is treated at a power in a range of from 5 watts to 10 watts. It has advantageously been found that treating the carbon (C) layer 218 at operation 115 with a plasma comprising hydrogen ($H_2$) or a plasma comprising a mixture of nitrogen ($N_2$) and hydrogen ($H_2$) improves inhibition of subsequent deposition of another layer, such as a titanium nitride (TiN) layer, thereon.

Referring to FIGS. 2A and 2D, at operation 120, the first titanium nitride (TiN) layer 220 is deposited using a deposition technique, such as, but not limited to, ALD, CVD, PVD, MBE, MOCVD, spin-on, or other insulating layer deposition techniques known to the skilled artisan. In one or more embodiments, the first TiN layer 220 is conformally deposited on the bottom surface 216 of the trench 200 by ALD. As used herein, as will be understood by the skilled artisan, a layer which is "conformal" or "conformally deposited" refers to a layer where the thickness is about the same throughout. A layer which is conformal varies in thickness by less than or equal to about 5%, 2%, 1% or 0.5%.

In some embodiments, the first TiN layer 220 is conformally deposited by sequentially exposing the trench 200 to a cycle including a titanium-containing precursor, purge, a nitrogen-containing precursor, and purge. The titanium-containing precursor may be any suitable precursor that includes titanium known to the skilled artisan. The nitrogen-containing precursor may be any suitable precursor that includes nitrogen known to the skilled artisan. In some embodiments, the titanium-containing precursor comprises titanium tetrachloride ($TiCl_4$) and the nitrogen-containing precursor comprises ammonia ($NH_3$).

In one or more embodiments, the first TiN layer 220 is a continuous layer. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

The method 100 may include any suitable number of cycles of operation 120 to form the first TiN layer 220 to a predetermined thickness. In one or more embodiments, operation 120 includes 10 cycles, 20 cycles, 30 cycles, 40 cycles, 50 cycles, 60 cycles, 70 cycles, 80 cycles, 90 cycles, or 100 cycles, as examples. In one or more embodiments, operation 120 includes 60 cycles.

The first TiN layer 220 can be deposited at any suitable temperature. In one or more embodiments, the first TiN layer 220 is deposited at a temperature in a range of from 200° C. to 500° C. In one or more embodiments, the first TiN layer 220 is deposited at a temperature of about 450° C.

The first TiN layer 220 may have any suitable thickness. In one or more embodiments, the first TiN layer 220 has a thickness in a range of from 5 Å to 50 Å. In one or more embodiments, the first TiN layer 220 has a thickness in a range of from 5 Å to 25 Å.

Referring to FIGS. 2A and 2E, at operation 130, the carbon (C) layer 218 is removed. The carbon (C) layer 218 may be removed by any process known to the skilled artisan, such that only the carbon (C) layer 218 is removed and no other layers/materials are removed. In one or more embodiments, the carbon (C) layer 218 is removed using an advanced pre-clean (APC) process. The APC process can be any suitable pre-cleaning process known to the skilled artisan.

In one or more embodiments, the APC process includes exposing the trench 200 to a plasma comprising oxygen ($O_2$) or a plasma comprising hydrogen ($H_2$) to remove the carbon (C) layer 218. In some embodiments, the plasma is a remote plasma. In some embodiments, the plasma is a capacitively coupled plasma (CCP) with a pulsed hydrogen ($H_2$) supply.

In one or more embodiments, removing the carbon (C) layer 218 includes a high temperature, high power process. In one or more embodiments, the carbon (C) layer 218 is removed at a temperature greater than 350° C. In one or more embodiments, the carbon (C) layer 218 is removed at a power of greater than 100 watts.

Advantageously, the APC process removes only the carbon (C) layer 218 and does not remove the first TiN layer 220. In one or more embodiments, the APC process increases a density of the first TiN layer 220.

In one or more embodiments, the APC process includes treating the carbon (C) layer 218, e.g., exposing the trench 200 to a plasma comprising oxygen ($O_2$) or a plasma comprising hydrogen ($H_2$) for a time period in a range of from 5 seconds to 2 minutes in order to remove the carbon (C) layer 218. The time period of the APC process depends on the carbon (C) layer 218 thickness and process conditions and can be adjusted based on the particular application.

In one or more embodiments, the carbon (C) layer 218 is removed before any growth from a subsequent deposition occurs on the carbon (C) layer 218. In one or more embodiments, the carbon (C) layer 218 is removed after one or more APC process cycles. In one or more embodiments, the carbon (C) layer 218 is removed after 10 APC process cycles, 20 APC process cycles, 30 APC process cycles, or 40 APC process cycles, for example.

Referring to FIGS. 2A and 2F, at operation 140, a second titanium nitride (TiN) layer 230 is deposited on the first titanium nitride (TiN) layer 220 using a deposition technique, such as, but not limited to, ALD, CVD, PVD, MBE, MOCVD, spin-on, or other insulating layer deposition techniques known to the skilled artisan. In one or more embodiments, the second TiN layer 230 is a continuous layer. In one or more embodiments, the second TiN layer 230 is conformally deposited on the first TiN layer 220 by ALD. The second TiN layer 230 may be deposited by the same process as operation 120 to deposit the first TiN layer 220. Advantageously, the first TiN layer 220 and the second TiN layer 230 combine to fill the trench 200 with a titanium nitride (TiN) gapfill material 250 that is substantially free of seams and/or voids or free of seams and/or voids. As used in this regard, "substantially free" means that less than about 5%, including less than about 4%, less than about 3%, less than about 2%, less than about 1%, less than about 0.5%, and less than about 0.1% of the total composition of the TiN gapfill material 250 an atomic basis, comprises seams and/or voids. Advantageously, in one or more embodiments, the titanium nitride (TiN) gapfill material 250 is free of seams and/or voids.

The skilled artisan will appreciate that one or more embodiments of the present disclosure are directed with reference to depositing a titanium nitride (TiN) gapfill material 250 that is free of seams and/or voids to fill a trench, e.g., trench 200, and that the disclosure is not limited to such embodiments. The methods described herein can be used to deposit other gapfill materials that are free of seams and/or voids. It is thought that the operations of method 100 can be used to deposit any metal gapfill materials and/or any metal nitride gapfill materials that are free of seams and/or voids. Advantageously, one or more embodiments of the disclosure are directed to depositing other gapfill materials, including, but not limited to, tungsten (W), aluminum (Al), molybdenum (Mo), molybdenum nitride (MoN), tantalum nitride (TaN), titanium silicon nitride (TiSiN), or tantalum silicon nitride (TaSiN).

Embodiments of the disclosure advantageously include method 100 comprising, consisting essentially of, or consisting of operation 110, operation 115, operation 120, operation 130, and operation 140 to fill the trench 200 with a gapfill material including, but not limited to, tungsten (W), aluminum (Al), molybdenum (Mo), molybdenum nitride (MoN), tantalum nitride (TaN), titanium silicon nitride (TiSiN), or tantalum silicon nitride (TaSiN) that is substantially free of seams and/or voids instead of using titanium nitride (TiN) in the process. Stated differently, for example, one or more tungsten (W), aluminum (Al), molybdenum (Mo), molybdenum nitride (MoN), tantalum nitride (TaN), titanium silicon nitride (TiSiN), or tantalum silicon nitride (TaSiN) can be used instead of titanium nitride (TiN) in method 100 to deposit the stated gapfill material (e.g., using tungsten (W) in method 100 instead of titanium nitride (TiN) would form a tungsten (W) gapfill material that is free of seams and/or voids).

Figure 3A:
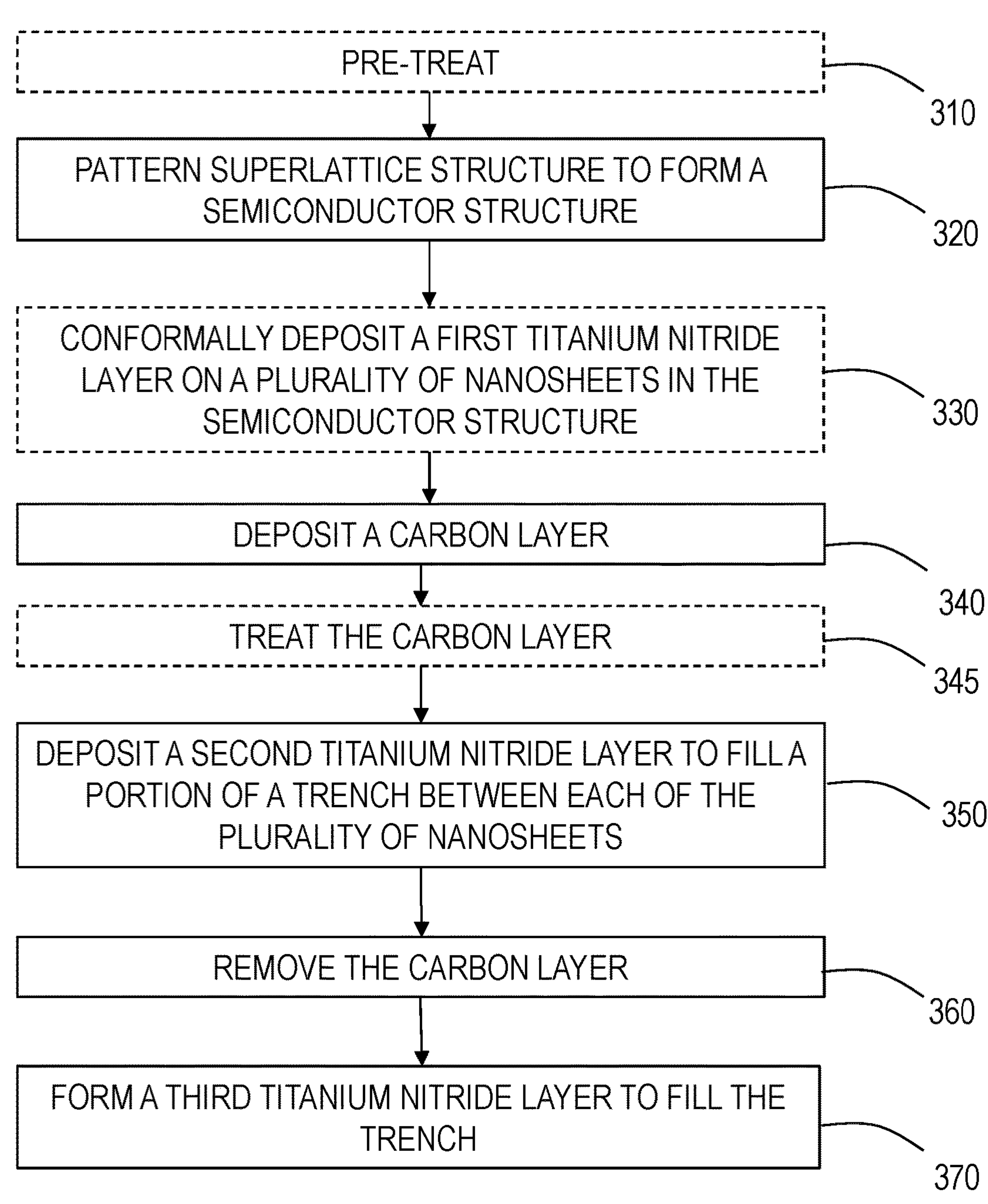
FIG. 3A illustrates a process flow diagram of a method of forming a semiconductor device in accordance with one or more embodiments of the disclosure.

FIG. 3A illustrates a process flow diagram of a method 300 of forming a semiconductor device 400. The semiconductor device 400, e.g., the GAA transistor, shown in FIGS. 3B-3H may be manufactured by the method 300 illustrated in FIG. 3A.

The method 300 comprises optionally pre-treating a semiconductor substrate 402 (operation 310); patterning a superlattice structure 403 on a top surface 402A of the semiconductor substrate 402 to form a semiconductor structure 405 (operation 320). The superlattice structure 403 comprises a plurality of nanosheet channel layers 404 and a corresponding plurality of nanosheet release layers 406 alternatingly arranged in a plurality of stacked pairs. In one or more embodiments, the method 300 includes patterning the superlattice structure 403 at operation 320 to remove the plurality of nanosheet release layers 406. The semiconductor structure comprises a plurality of nanosheets 404, and each of the plurality of nanosheets 404 is separated by a trench 408.

The method 300 optionally includes conformally depositing a first titanium nitride (TiN) layer 410 on the plurality of nanosheets 404 (operation 330). The method 300 includes depositing a carbon (C) layer 412 on a portion of the first TiN layer 410 (operation 340); optionally, treating the carbon (C) layer 412 (operation 345); and forming a second titanium nitride (TiN) layer 420 to fill a portion of the trench 408 (operation 350). The second TiN layer 420 grows from within the trench 408.

The method 300 includes removing the carbon (C) layer 412 (operation 360); and forming a third titanium nitride (TiN) layer (operation 370). The first TiN layer 410 the second TiN layer 420, and the third TiN layer combine to fill the trench 408 with a titanium nitride (TiN) gapfill material 450 that is substantially free of seams and/or voids.

In one or more embodiments, the method 300 consists essentially of operation 310, operation 320, operation 330, operation 340, operation 345, operation 350, operation 360, and operation 370. In one or more embodiments, the method 300 consists of operation 310, operation 320, operation 330, operation 340, operation 345, operation 350, operation 360, and operation 370.

In one or more embodiments, the method 300 comprising optional operation 310, operation 320, optional operation 330, operation 340, optionally operation 345, operation 350, operation 360, and operation 370 defines a process cycle. The process cycle may be repeated any suitable number of times in order to form a gapfill material having a predetermined thickness. The process cycle may be repeated any suitable number of times depending on the processing conditions. In one or more embodiments, the process cycle comprising, consisting essentially of, or consisting of operation 310, operation 320, operation 330, operation 340, operation 345, operation 350, operation 360, and operation 370 is repeated at least once.

Figures 3B, 3C:
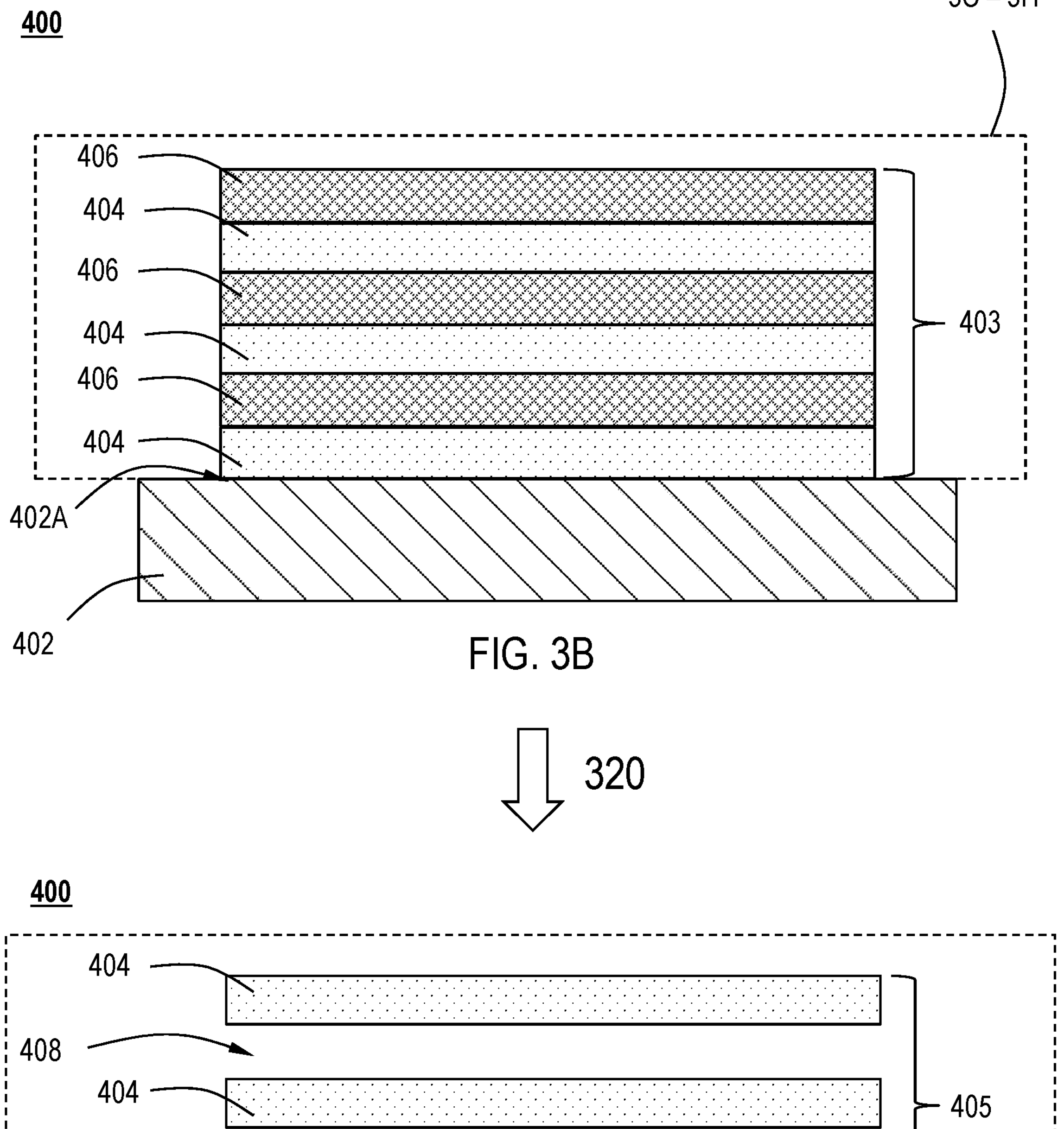
FIG. 3B illustrates a cross-sectional schematic view of a semiconductor device having a superlattice structure on a top surface of a semiconductor substrate prior to a patterning process in accordance with one or more embodiments of the disclosure.
FIG. 3C illustrates a cross-sectional schematic view of the semiconductor device of FIG. 3B including a semiconductor structure having a plurality of nanosheets separated by a trench formed after the patterning process.

FIG. 3B illustrates a cross-sectional schematic view of the semiconductor device 400 including superlattice structure 403 (e.g., a vertically stacked superlattice structure) on the top surface 402A of the semiconductor substrate 402. The semiconductor substrate 402 can be any suitable substrate material. In one or more embodiments, the semiconductor substrate 402 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 402 comprises one or more of silicon (Si), germanium (Ge), gallium (Ga), arsenic (As), indium (In), phosphorus (P), or selenium (Se). Although a few examples of materials from which the semiconductor substrate 402 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 402 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In some embodiments, the superlattice structure 403 comprises alternating layers of nanosheet channel layer 404 and nanosheet release layer 406. In some embodiments, the plurality of nanosheet release layers 406 and the plurality of nanosheet channel layers 404 can comprise any number of lattice matched material pairs suitable for forming the vertically stacked superlattice structure 403. In some embodiments, the superlattice structure 403 has in a range of from 1 to 5 pairs of alternating layers of nanosheet channel layers 404 and nanosheet release layers 406.

The nanosheet release layers 406 may have any suitable thickness. In one or more embodiments, each nanosheet release layer 406 has a thickness in a range of from 5 nm to 15 nm. The nanosheet channel layers 404 may have any suitable thickness. In one or more embodiments, each nanosheet channel layer 404 has a thickness in a range of from 5 nm to 15 nm.

In some embodiments, each of the nanosheet channel layers 404 independently comprises silicon (Si). In some embodiments, each of the nanosheet release layers 406 independently comprises silicon germanium (SiGe).

In some embodiments, each of the nanosheet channel layers 404 independently comprises silicon germanium (SiGe). In some embodiments, each of the nanosheet release layers 406 independently comprises silicon (Si).

FIG. 3B includes a region that is denoted by a dashed-box that is labeled 3C-3H. The region labeled 3C-3H is illustrated in FIGS. 3C-3H and shows subsequent operations/processes of the methods described herein.

FIG. 3C illustrates the semiconductor device 400 after the patterning process. More particularly, FIG. 3C illustrates a cross-sectional schematic view of the semiconductor structure 405 having the plurality of nanosheets 404 separated by a trench 408 formed after the patterning process. The patterning process may include any suitable process known to the skilled artisan. The patterning process is performed at operation 320 to remove the plurality of nanosheet release layers 406 and form the trench 408. The plurality of nanosheet channel layers 404 from the superlattice structure 403 remain in the semiconductor structure 405 after the patterning process and will be referred to as "the plurality of nanosheets 404." The plurality of nanosheets 404 may include any number of nanosheets 404. The Figures include three nanosheets 404 for illustrative purposes. It is to be understood that the disclosure is not limited to a semiconductor device having three nanosheets.

The trench 408 can have any suitable aspect ratio (ratio of the depth of the trench to the width of the trench). In some embodiments, the aspect ratio is greater than or equal to about 5:1, 10:1, 15:1, 20:1, 25:1, 30:1, 35:1, 40:1, 45:1, 50:1, 75:1, or 100:1.

In one or more embodiments, the method 300 optionally includes pre-treating the semiconductor substrate 402 (operation 310) prior to conformally depositing the first TiN layer 410 (operation 330). In one or more embodiments, the semiconductor substrate 402 may be treated prior to patterning the superlattice structure 403 to form the semiconductor structure 405 (operation 320), after patterning the superlattice structure 403, or both.

The pre-treatment at operation 310 can be any suitable pre-treatment known to the skilled artisan. Suitable pre-treatments include, but are not limited to, pre-heating, cleaning, soaking, native oxide removal, or deposition or removal of any material, or any processing operation used to fabricate the GAA transistors of the present disclosure.

Figures 3D, 3E, 3F:
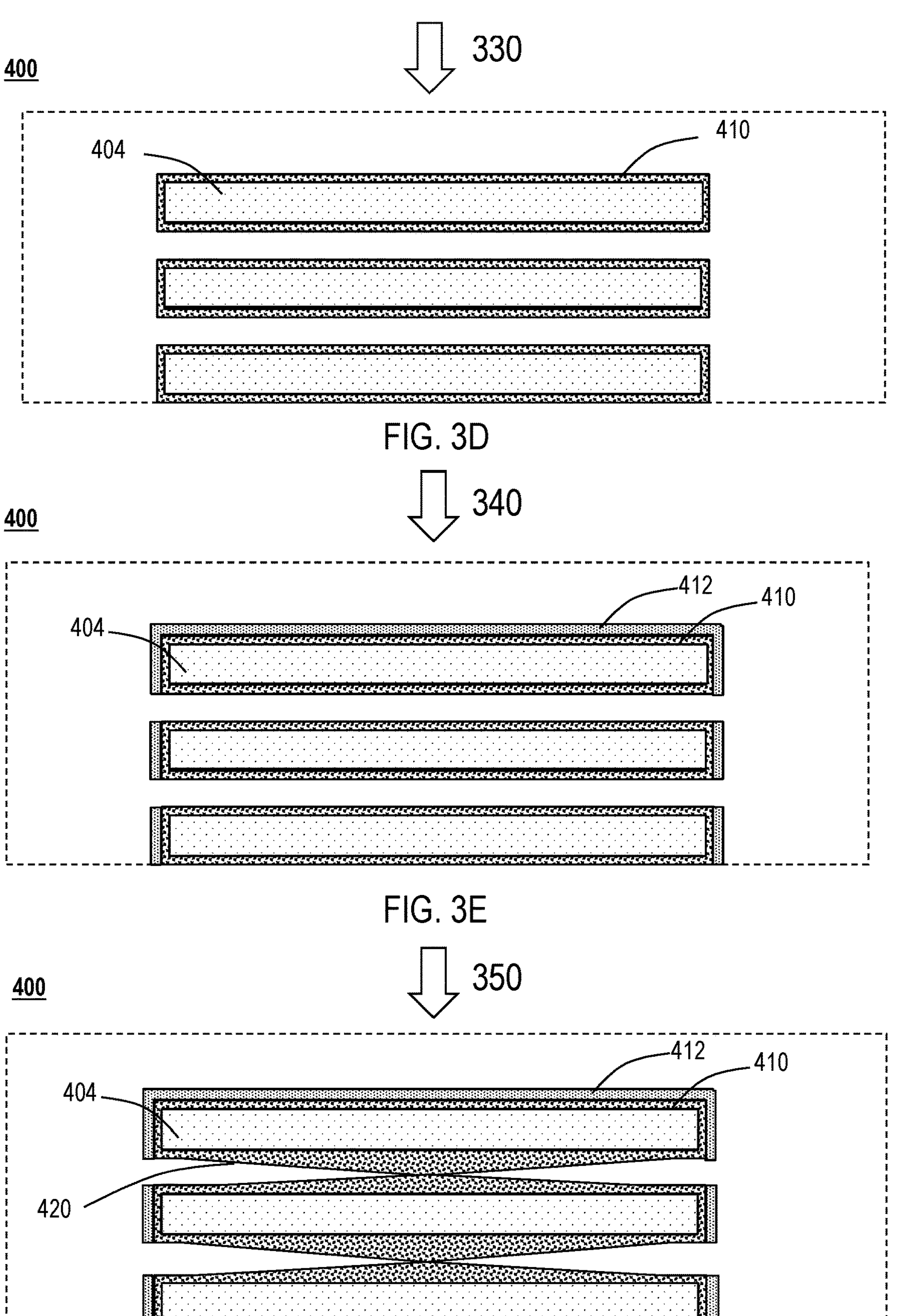
FIG. 3D illustrates a cross-sectional schematic view of the semiconductor device of FIG. 3C after conformally depositing a first titanium nitride (TiN) layer.
FIG. 3E illustrates a cross-sectional schematic view of the semiconductor device of FIG. 3D after depositing a carbon (C) layer on a portion of the first TiN layer.
FIG. 3F illustrates a cross-sectional schematic view of the semiconductor device of FIG. 3E after forming a second titanium nitride (TiN) layer to fill a portion of the trench.

FIG. 3D illustrates a cross-sectional schematic view of the semiconductor device 400 of FIG. 3C after conformally depositing the first titanium nitride (TiN) layer 410 on the plurality of nanosheets 404 (operation 330 of method 300). As used herein, as will be understood by the skilled artisan, a layer which is "conformal" or "conformally deposited" refers to a layer where the thickness is about the same throughout. A layer which is conformal varies in thickness by less than or equal to about 5%, 2%, 1% or 0.5%.

In one or more embodiments, the first TIN layer 410 is conformally deposited by atomic layer deposition (ALD). In some embodiments, the first TiN layer 410 is conformally deposited by sequentially exposing the semiconductor substrate 402 (e.g., the plurality of nanosheets 404 of the semiconductor structure 405) to a titanium-containing precursor, purge, a nitrogen-containing precursor, purge. The titanium-containing precursor may be any suitable precursor that includes titanium known to the skilled artisan. The nitrogen-containing precursor may be any suitable precursor that includes nitrogen known to the skilled artisan. In some embodiments, the titanium-containing precursor comprises titanium tetrachloride ($TiCl_4$) and the nitrogen-containing precursor comprises ammonia ($NH_3$).

In one or more embodiments, the first TiN layer 410 is a continuous layer. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

FIG. 3E illustrates a cross-sectional schematic view of the semiconductor device 400 of FIG. 3D after depositing a carbon (C) layer 412 on a portion of the first TiN layer 410 (operation 340 of method 300). The first TiN layer 410 has a portion that is not within the trench 408 and a portion that is within the trench 408.

In one or more embodiments, the carbon (C) layer 412 is deposited using PVD or CVD. In one or more embodiments, the carbon (C) layer 412 is deposited using PVD.

The carbon (C) layer 412 has a top surface thickness and a sidewall thickness. In one or more embodiments, the thickness (the top surface thickness and the sidewall thickness) of the carbon (C) layer 412 varies and depends on the dimensions of the trench 408. In one or more embodiments, such as when the carbon (C) layer 412 is deposited by PVD the top surface thickness is greater than the sidewall thickness.

In one or more embodiments, the top surface thickness is in a range of from 5 Å to 50 Å. In one or more embodiments, the sidewall thickness is in a range of from 5 Å to 40 Å. In one or more embodiments, the sidewall thickness varies within the range of from 5 Å to 40 Å depending on the particular process conditions.

In one or more embodiments, the method 300 further comprises treating the carbon (C) layer 412 with a plasma at operation 345. In one or more embodiments, the carbon (C) layer 412 deposited by PVD is treated with the plasma at operation 345. In one or more embodiments, the carbon (C) layer 412 deposited by CVD is treated with the plasma at operation 345. The carbon (C) layer 412 may be treated with the plasma (operation 345) in any suitable processing chamber that has plasma capability, including but not limited to, PVD chambers and CVD chambers.

The plasma include any suitable composition. The plasma may be generated by any suitable plasma source known to the skilled artisan. In one or more embodiments, the plasma used to treat the carbon (C) layer 412 comprises hydrogen ($H_2$) or a mixture of nitrogen ($N_2$) and hydrogen ($H_2$). The plasma comprising the mixture of nitrogen ($N_2$) and hydrogen ($H_2$) may include any suitable ratio of nitrogen ($N_2$) and hydrogen ($H_2$) in the mixture. In one or more embodiments, treating the carbon (C) layer 412 at operation 345 includes a low temperature, low power process. In one or more embodiments, the carbon (C) layer 412 is treated at a temperature less than or equal to 350° C., less than or equal to 300° C., less than or equal to 250° C., less than or equal to 200° C., less than or equal to 150° C., less than or equal to 100° C., less than or equal to 50° C., or less than or equal to room temperature. In one or more embodiments, the carbon (C) layer 412 is treated at a power of less than or equal to 100 watts, less than or equal to 50 watts, less than or equal to 25 watts, or less than or equal to 10 watts. In one or more embodiments, the carbon (C) layer 412 is treated at a power in a range of from 5 watts to 10 watts. It has advantageously been found that treating the carbon (C) layer 412 at operation 345 with a plasma comprising hydrogen ($H_2$) or a plasma comprising a mixture of nitrogen ($N_2$) and hydrogen ($H_2$) improves inhibition of subsequent deposition of another layer, such as a titanium nitride (TiN) layer, thereon.

It has been found that adsorption strength of the titanium-containing precursor used to form the TiN layers on the carbon (C) layer 412 is very low compared to adsorption strength of the titanium-containing precursor on a clean substrate surface, such as a silicon surface, a silicon oxide surface, or a titanium nitride (TiN) surface. It has also been found that the titanium-containing precursor desorbs from the surface of the carbon (C) layer 412, under normal processing temperature conditions, such as in a range of about 100°° C. to about 500° C., demonstrating weak adsorption and inhibition of titanium nitride (TiN) growth.

The carbon (C) layer 412 does not form within the trench 408 or on the portion of the first TiN layer 410 that is within the trench 408. The carbon (C) atoms that form the carbon (C) layer 412 have a molecular size that is too large to fit within the trench 408, such as a trench having an AR greater than or equal to about 5:1, 10:1, 15:1, 20:1, 25:1, 30:1, 35:1, 40:1, 45:1, 50:1, 75:1, or 100:1.

The carbon (C) layer 412 advantageously allows for continued deposition within the trench 408 between the plurality of nanosheets 404. The carbon (C) layer 412 facilitates achievement of selective deposition on the first TiN layer 210 relative to within the trench 408.

The carbon (C) layer 412 may be a continuous layer. It has been found that the carbon (C) atoms selectively react with and bind to the target surface, e.g., the surfaces of the first TiN layer 410. Accordingly, the skilled artisan will appreciate that the carbon (C) layer 412 will prevent subsequent deposition, e.g., on the first TiN layer 410, even if the carbon (C) layer 412 is not a continuous layer.

As the technology node advances, for example, when scaling semiconductor devices to the 3 nm node and beyond BEOL includes new interfaces such as tungsten (W), molybdenum (Mo), and ruthenium (Ru). Improving the selectivity of the carbon (C) atoms on metal to low-K surfaces becomes more challenging, especially when these interfaces contain different kinds of impurities such as oxygen, carbon, nitrogen, fluorine, chlorine, etc. It has been determined that the pre-clean before depositing a carbon (C) layer further improves the selectivity of the carbon (C) layer. Pre-cleaning helps control damage to low-K dielectric materials.

In some embodiments, the first TiN layer 410 is cleaned prior to depositing the carbon (C) layer 412. In some embodiments, the surface of the first TiN layer 410 is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma is formed by a remote plasma source. In some embodiments, the hydrogen plasma comprises plasma of $H_2$. In some embodiments, the hydrogen plasma comprises, consists essentially of, or consists of a combination of argon (Ar) and hydrogen ($H_2$). In some embodiments, the hydrogen plasma comprises, consists essentially of, or consists of a combination of helium (He) and hydrogen ($H_2$).

Pre-cleaning of the first TiN layer 410 can occur at any suitable temperature depending on, for example, the cleaning technique. In some embodiments, pre-cleaning of the first TiN layer 410 occurs at a temperature in a range of from 20° C. to 500° C.

FIG. 3F illustrates a cross-sectional schematic view of the semiconductor device 400 of FIG. 3E after forming a second titanium nitride (TiN) layer 420 to fill a portion of the trench 408 (operation 350 of method 300).

In one or more embodiments, the second TiN layer 420 is grown from within the trench 408. The carbon (C) layer 412 prevents growth of the second TiN layer 420 on the portion of the first TiN layer 410 that is not within the trench 408. The second TiN layer 420 may be grown by any suitable deposition process known to the skilled artisan. In some embodiments, the second TiN layer 420 is grown by an epitaxial growth process. "Epitaxy" is a process by which a deposited film is forced into a high degree of crystallographic alignment with the substrate. Epitaxial growth is broadly defined as the condensation of gas precursors to form a film on a substrate. Liquid precursors may also be used. Vapor precursors may be obtained by chemical vapor deposition (CVD) and laser ablation. The epitaxial growth process of operation 350 of method 100 includes, but is not limited to, molecular beam epitaxy (MBE), epitaxial CVD, or atomic layer epitaxy (ALE). In one or more embodiments, the second TiN layer 420 is a continuous layer.

In one or more embodiments, the second TiN layer 420 is grown by an epitaxial growth process with a gradient thickness. In one or more embodiments where the second TiN layer 420 has a gradient thickness, the thickness of the second TiN layer 420 decreases from within the trench 408 towards an outside of the trench.

In one or more embodiments, the first TiN layer 410 and the second TiN layer 420 have the same composition. In some embodiments, the second TiN layer 420 is formed by exposing the surface to a titanium-containing precursor (titanium tetrachloride ($TiCl_4$)) and a nitrogen-containing precursor (ammonia ($NH_3$)).

Advantageously, in embodiments where the titanium-containing precursor comprises titanium tetrachloride ($TiCl_4$) and the nitrogen-containing precursor comprises ammonia ($NH_3$), the respective titanium-containing precursor and the nitrogen-containing precursor each have a molecular size that fit within the trench 408. It has been found that $TiCl_4$ has a molecular size of about 3.8 Å and $NH_3$ has a molecular size of about 1.6 Å,which advantageously allows for epitaxial growth within the trench 408 having an AR greater than or equal to about 5:1, 10:1, 15:1, 20:1, 25:1, 30:1, 35:1, 40:1, 45:1, 50:1, 75:1, or 100:1.

Figures 3G, 3H:
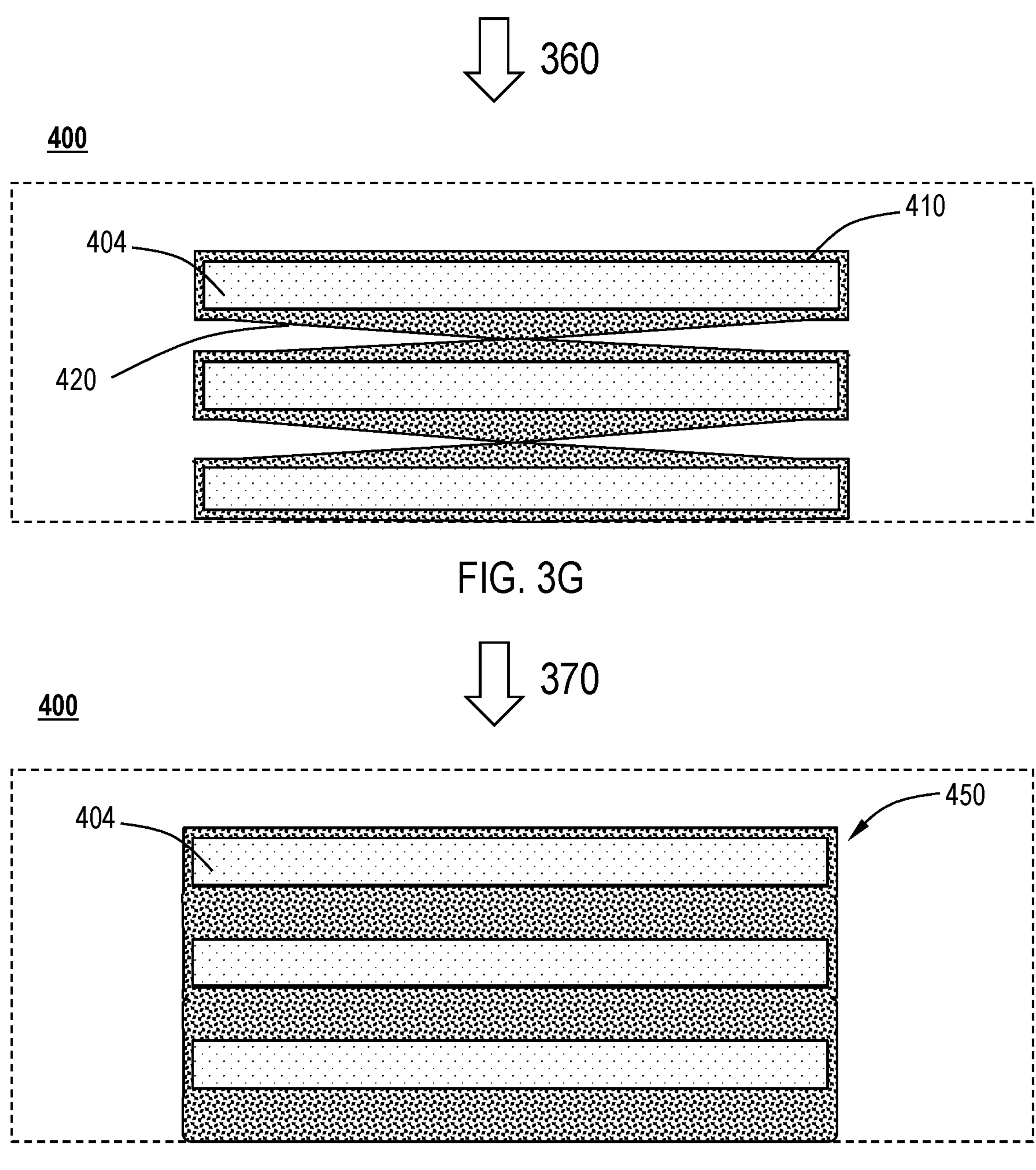
FIG. 3G illustrates a cross-sectional schematic view of the semiconductor device of FIG. 3F after removing the carbon (C) layer.
FIG. 3H illustrates a cross-sectional schematic view of the semiconductor device of FIG. 3G after forming a third titanium nitride (TiN) layer, the first TiN layer, the second TiN layer, and the third TiN layer combining to fill the trench with a titanium nitride (TiN) gapfill material in accordance with one or more embodiments of the disclosure.

FIG. 3G illustrates a cross-sectional schematic view of the semiconductor device 400 of FIG. 3F after removing the carbon (C) layer 412 (operation 360 of method 300).

The carbon (C) layer 412 may be removed by any process known to the skilled artisan, such that only the carbon (C) layer 412 is removed and no other layers/materials are removed. In one or more embodiments, the carbon (C) layer 412 is removed using an advanced pre-clean (APC) process. The APC process can be any suitable pre-cleaning process known to the skilled artisan.

In one or more embodiments, the APC process includes exposing the semiconductor structure 405 to a plasma comprising oxygen ($O_2$) or a plasma comprising hydrogen ($H_2$) to remove the carbon (C) layer 412. In some embodiments, the plasma is a remote plasma. In some embodiments, the plasma is a capacitively coupled plasma (CCP) with a pulsed hydrogen ($H_2$) supply. Advantageously, the APC processes removes only the carbon (C) layer 412 and does not remove the first TiN layer 410 or the second TiN layer 420.

In one or more embodiments, the APC process includes treating the carbon (C) layer 412, e.g., exposing the semiconductor structure 405 to a plasma comprising oxygen ($O_2$) or a plasma comprising hydrogen ($H_2$) for a time period in a range of from 5 seconds to 2 minutes in order to remove the carbon (C) layer 412. The time period of the APC process depends on the carbon (C) layer 412 thickness and process conditions and can be adjusted based on the particular application.

FIG. 3H illustrates a cross-sectional schematic view of the semiconductor device 400 of FIG. 3G after forming a third titanium nitride (TiN) layer. In one or more embodiments, the first TiN layer 410, the second TiN layer 420, and the third TiN layer have the same composition. The first TiN layer 410, the second TiN layer 420, and the third TiN layer combine to fill the trench 408 with a titanium nitride (TiN) gapfill material 450 (operation 370 of method 30) that is substantially free of seams and/or voids. Accordingly, the reference numeral 450 denotes a combination of the first TiN layer 410, the second TiN layer 420, and the third TiN layer as a TiN gapfill material 450 that is free of seams and/or voids.

The skilled artisan will appreciate that one or more embodiments of the present disclosure are directed with reference to depositing a titanium nitride (TiN) gapfill material 450 that is free of seams and/or voids to fill a trench, e.g., trench 408, and that the disclosure is not limited to such embodiments. The methods described herein can be used to deposit other gapfill materials that are free of seams and/or voids. It is thought that the operations of method 300 can be used to deposit any metal gapfill materials and/or any metal nitride gapfill materials that are free of seams and/or voids. Accordingly, the skilled artisan will appreciate that a metal gapfill material and/or metal nitride gapfill materials other than titanium nitride (TiN) can be deposited using method 300. Advantageously, one or more embodiments of the disclosure are directed to depositing other gapfill materials, including, but not limited to, tungsten (W), aluminum (Al), molybdenum (Mo), molybdenum nitride (MoN), tantalum nitride (TaN), titanium silicon nitride (TiSiN), or tantalum silicon nitride (TaSiN).

Embodiments of the disclosure advantageously include method 300 comprising, consisting essentially of, or consisting of operation 310, operation 320, operation 330, operation 340, operation 345, operation 350, operation 360, and operation 370 to fill the trench 408 with a gapfill material including, but not limited to, tungsten (W), aluminum (Al), molybdenum (Mo), molybdenum nitride (MoN), tantalum nitride (TaN), titanium silicon nitride (TiSiN), or tantalum silicon nitride (TaSiN) that is substantially free of seams and/or voids instead of using titanium nitride (TiN) in the process. Stated differently, for example, one or more tungsten (W), aluminum (Al), molybdenum (Mo), molybdenum nitride (MoN), tantalum nitride (TaN), titanium silicon nitride (TiSiN), or tantalum silicon nitride (TaSiN) can be used instead of titanium nitride (TiN) in method 300 to deposit the stated gapfill material (e.g., using tungsten (W) in method 300 instead of titanium nitride (TiN) would form a tungsten (W) gapfill material that is free of seams and/or voids).

Figure 4:
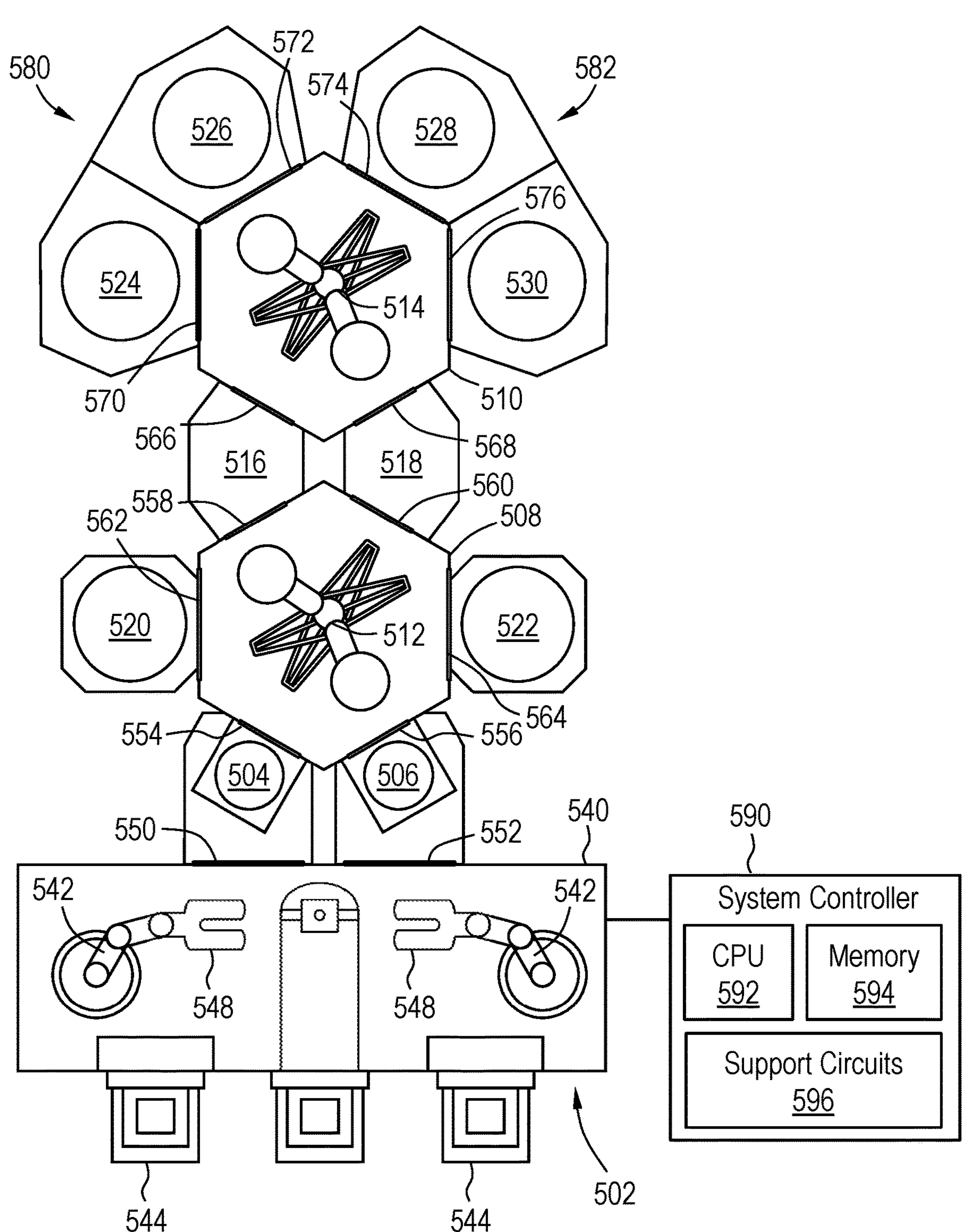
FIG. 4 illustrates a schematic top-view diagram of an example multi-chamber processing system in accordance with one or more embodiments of the disclosure.

Some embodiments of the disclosure are directed to integrated processes which are performed within a single cluster tool. FIG. 4 is a schematic top-view diagram of an example multi-chamber processing system 500 according to one or more embodiments. The processing system 500 generally includes a factory interface 502, load lock chambers 504, 506, transfer chambers 508, 510 with respective transfer robots 512, 514, holding chambers 516, 518, and processing chambers 520, 522, 524, 526, 528, 530. As detailed herein, wafers in the processing system 500 can be processed in and transferred between the various chambers without exposing the wafers to an ambient environment exterior to the processing system 500 (e.g., an atmospheric ambient environment such as may be present in a fab). For example, the wafers can be processed in and transferred between the various chambers in a low pressure (e.g., less than or equal to about 40 to 80 Torr) or vacuum environment without breaking the low pressure or vacuum environment between various processes performed on the wafers in the processing system 500. Accordingly, the processing system 500 may provide an integrated solution for some processing of wafers.

As used herein, the term "in situ" refers to processes that are all performed in the same processing chamber or within different processing chambers that are connected as part of an integrated processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air.

The methods described herein (method 100 and method 300) may be performed in the processing system 500. One or more operations of method 100 may be performed in situ. One or more operations of method 100 may be performed ex situ. One or more operations of method 300 may be performed in situ. One or more operations of method 300 may be performed ex situ.

In the illustrated example of FIG. 4, the factory interface 502 includes a docking station 540 and factory interface robots 542 to facilitate transfer of wafers. The docking station 540 is configured to accept one or more front opening unified pods (FOUPs) 544. In some examples, each factory interface robot 542 generally comprises a blade 548 disposed on one end of the respective factory interface robot 542 configured to transfer the wafers from the factory interface 502 to the load lock chambers 504, 506.

The load lock chambers 504, 506 have respective ports 550, 552 coupled to the factory interface 502 and respective ports 554, 556 coupled to the transfer chamber 508. The transfer chamber 508 further has respective ports 558, 560 coupled to the holding chambers 516, 518 and respective ports 562, 564 coupled to processing chambers 520, 522.

Similarly, the transfer chamber 510 has respective ports 566, 568 coupled to the holding chambers 516, 518 and respective ports 570, 572, 574, 576 coupled to processing chambers 524, 526, 528, 530. The ports 554, 556, 558, 560, 562, 564, 566, 568, 570, 572, 574, 576 can be, for example, slit valve openings with slit valves for passing wafers therethrough by the transfer robots 512, 514 and for providing a seal between respective chambers to prevent a gas from passing between the respective chambers. Generally, any port is open for transferring a wafer therethrough. Otherwise, the port is closed.

The load lock chambers 504, 506, transfer chambers 508, 510, holding chambers 516, 518, and processing chambers 520, 522, 524, 526, 528, 530 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 542 transfers a wafer from a FOUP 544 through a port 550 or 552 to a load lock chamber 504 or 506. The gas and pressure control system then pumps down the load lock chamber 504 or 506. The gas and pressure control system further maintains the transfer chambers 508, 510 and holding chambers 516, 518 with an interior low pressure or vacuum environment (which may include an inert gas). Hence, the pumping down of the load lock chamber 504 or 506 facilitates passing the wafer between, for example, the atmospheric environment of the factory interface 502 and the low pressure or vacuum environment of the transfer chamber 508.

With the wafer in the load lock chamber 504 or 506 that has been pumped down, the transfer robot 512 transfers the wafer from the load lock chamber 504 or 506 into the transfer chamber 508 through the port 554 or 556. The transfer robot 512 is then capable of transferring the wafer to and/or between any of the processing chambers 520, 522 through the respective ports 562, 564 for processing and the holding chambers 516, 518 through the respective ports 558, 560 for holding to await further transfer. Similarly, the transfer robot 514 is capable of accessing the wafer in the holding chamber 516 or 518 through the port 566 or 568 and is capable of transferring the wafer to and/or between any of the processing chambers 524, 526, 528, 530 through the respective ports 570, 572, 574, 576 for processing and the holding chambers 516, 518 through the respective ports 566, 568 for holding to await further transfer. The transfer and holding of the wafer within and among the various chambers can be in the low pressure or vacuum environment provided by the gas and pressure control system.

The processing chambers 520, 522, 524, 526, 528, 530 can be any appropriate chamber for processing a wafer. In some embodiments, the processing chambers 520, 522, 524, 526, 528, 530 can be capable of performing a pre-treatment process, a cleaning process, a deposition process, such as an ALD process, a carbon (C) layer PVD and/or CVD process, or an epitaxial growth process.

A system controller 590 is coupled to the processing system 500 for controlling the processing system 500 or components thereof. For example, the system controller 590 may control the operation of the processing system 500 using a direct control of the chambers 504, 506, 508, 516, 518, 510, 520, 522, 524, 526, 528, 530 of the processing system 500 or by controlling controllers associated with the chambers 504, 506, 508, 516, 518, 510, 520, 522, 524, 526, 528, 530. In operation, the system controller 590 enables data collection and feedback from the respective chambers to coordinate performance of the processing system 500.

The system controller 590 generally includes a central processing unit (CPU) 592, memory 594, and support circuits 596. The CPU 592 may be one of any form of a general-purpose processor that can be used in an industrial setting. The memory 594, or non-transitory computer-readable medium, is accessible by the CPU 592 and may be one or more of memory such as random-access memory (RAM), read only memory (ROM), floppy disk, hard disk, or any other form of digital storage, local or remote. The support circuits 596 are coupled to the CPU 592 and may comprise cache, clock circuits, input/output subsystems, power supplies, and the like. The various methods disclosed herein may generally be implemented under the control of the CPU 592 by the CPU 592 executing computer instruction code stored in the memory 594 (or in memory of a particular process chamber) as, for example, a software routine. When the computer instruction code is executed by the CPU 592, the CPU 592 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 508, 510 and the holding chambers 516, 518. In other examples, more or fewer transfer chambers (e.g., one transfer chamber) and/or more or fewer holding chambers (e.g., no holding chambers) may be implemented as a transfer apparatus in a processing system.

One or more embodiments provide a non-transitory computer readable medium (e.g., memory 594) including instructions, that, when executed by a controller (e.g., controller 590) of a processing chamber (or a multi-chamber processing system 500), causes the processing chamber to perform one or more of the operations of method 100. One or more embodiments provide a non-transitory computer readable medium (e.g., memory 594) including instructions, that, when executed by a controller (e.g., controller 590) of a processing chamber (or a multi-chamber processing system 500), causes the processing chamber to perform one or more of the operations of method 300.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of filling a trench in a semiconductor substrate, the method comprising:

depositing a carbon (C) layer on the trench, the trench including a top surface, a bottom surface, and two opposed sidewalls, the carbon (C) layer forming on the top surface and on a portion of the two opposed sidewalls;

conformally depositing a first titanium nitride (TiN) layer on the bottom surface of the trench;

removing the carbon (C) layer; and depositing a second titanium nitride (TiN) layer on the first TiN layer, the first TIN layer and the second TiN layer combining to fill the trench with a titanium nitride (TiN) gapfill material that is substantially free of seams and/or voids.

2. The method of claim 1, wherein the carbon (C) layer has a top surface thickness, and a sidewall thickness, and the top surface thickness is greater than the sidewall thickness.

3. The method of claim 2, wherein the top surface thickness is in a range of from 5 Å to 50 Å and the sidewall thickness is in a range of from 5 Å to 40 Å.

4. The method of claim 3, wherein the sidewall thickness is a gradient thickness that is in the range of from 5 Å to 40 Å.

5. The method of claim 1, wherein the carbon (C) layer is deposited by physical vapor deposition (PVD) or chemical vapor deposition (CVD).

6. The method of claim 5, further comprising treating the carbon (C) layer with a plasma comprising hydrogen ($H_2$) or a plasma comprising a mixture of nitrogen ($N_2$) and hydrogen ($H_2$).

7. The method of claim 6, wherein the plasma comprises hydrogen (H2).

8. The method of claim 6, wherein the plasma comprises the mixture of nitrogen (N2) and hydrogen (H2).

9. The method of claim 5, wherein the carbon (C) layer is deposited by physical vapor deposition (PVD).

10. The method of claim 1, wherein the carbon (C) layer is removed using an advanced pre-clean (APC) process.

11. The method of claim 10, wherein the APC process includes exposing the trench to a plasma comprising oxygen (O2) or a plasma comprising hydrogen (H2) to remove the carbon (C) layer.

12. The method of claim 11, wherein the APC process is configured to remove the carbon (C) layer without removing the first TiN layer.

13. The method of claim 1, wherein the trench has an aspect ratio in a range of from 1:1 to 100:1.

14. The method of claim 1, wherein forming one or more of the first TiN layer or the second TiN layer comprises an atomic layer deposition (ALD) process.

15. The method of claim 14, wherein forming one or more of the first TiN layer or the second TiN layer comprises exposing the semiconductor substrate to a titanium-containing precursor and a nitrogen-containing precursor.

16. The method of claim 15, wherein the titanium-containing precursor comprises titanium tetrachloride ($TiCl_4$) and the nitrogen-containing precursor comprises ammonia (NH3).

17. The method of claim 14, wherein one or more of the first TiN layer or the second TiN layer is formed at a temperature in a range of from 200° C. to 500° C.

18. The method of claim 14, wherein one or more of the first TiN layer or the second TiN layer has a thickness in a range of from 5 Å to 50 Å.

19. The method of claim 18, wherein one or more of the first TiN layer or the second TiN layer has a thickness in a range of from 5 Å to 25 Å.

20. The method of claim 14, wherein forming one or more of the first TiN layer or the second TiN layer occurs in the same semiconductor processing chamber.

* * * * *